(12) United States Patent
Khlat

(10) Patent No.: US 10,742,192 B2
(45) Date of Patent: Aug. 11, 2020

(54) TUNABLE NOTCH FILTER

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 35 days.

(21) Appl. No.: 16/167,804

(22) Filed: Oct. 23, 2018

(65) Prior Publication Data

US 2019/0260355 A1     Aug. 22, 2019

Related U.S. Application Data

(60) Provisional application No. 62/633,356, filed on Feb. 21, 2018.

(51) Int. Cl.
| | |
|---|---|
| *H03H 9/54* | (2006.01) |
| *H03H 9/64* | (2006.01) |
| *H04B 1/00* | (2006.01) |
| *H04B 1/10* | (2006.01) |
| *H03H 9/02* | (2006.01) |

(52) U.S. Cl.
CPC .......... *H03H 9/547* (2013.01); *H03H 9/6409* (2013.01); *H04B 1/006* (2013.01); *H04B 1/1027* (2013.01); *H03H 9/02007* (2013.01); *H03H 2009/02165* (2013.01); *H03H 2210/025* (2013.01); *H04B 2001/1063* (2013.01)

(58) Field of Classification Search
CPC .......... H03H 9/547; H03H 9/6409; H03H 2210/025; H03H 2009/02165; H03H 9/02007; H03H 9/542; H03H 9/6403; H03H 2009/02204; H03H 2210/015; H04B 1/1027; H04B 1/006; H04B 2001/1063; H04B 1/1036

USPC .......... 333/133, 186, 187, 188, 193–196
See application file for complete search history.

(56) References Cited

U.S. PATENT DOCUMENTS

| | | |
|---|---|---|
| 9,065,504 B2 | 6/2015 | Kwon et al. |
| 9,698,839 B2 | 7/2017 | Khlat |
| (Continued) | | |

OTHER PUBLICATIONS

Non-Final Office Action for U.S. Appl. No. 15/006,540, dated Aug. 5, 2016, 7 pages.

(Continued)

*Primary Examiner* — Robert J Pascal
*Assistant Examiner* — Jorge L Salazar, Jr.
(74) *Attorney, Agent, or Firm* — Withrow & Terranova, P.L.L.C.

(57) ABSTRACT

A tunable notch filter is disclosed with a first acoustic resonator coupled in series with a first inductive element between a filter input node and a filter output node. A first capacitor is coupled in parallel with the first acoustic resonator and the first inductive element. In at least one embodiment, the first capacitor is configured to have variable capacitance that is electronically tunable by way of an electronic controller. A second acoustic resonator is coupled in series with a second inductive element between the filter output node and a signal ground node. A second capacitor is coupled in parallel with the second inductive element. In at least one embodiment, the second capacitor is electronically tunable. The tunable notch filter is configured to provide a highly selective notch filter response between the filter input node and the filter output node with high attenuation.

22 Claims, 10 Drawing Sheets

(56) References Cited

U.S. PATENT DOCUMENTS

| | | | |
|---|---|---|---|
| 2002/0019218 A1* | 2/2002 | Greverie | H03G 3/3042 |
| | | | 455/127.1 |
| 2009/0268796 A1* | 10/2009 | Shenouda | H04B 1/40 |
| | | | 375/222 |
| 2010/0291946 A1 | 11/2010 | Yamakawa et al. | |
| 2011/0103439 A1 | 5/2011 | McKay et al. | |
| 2016/0204763 A1* | 7/2016 | Tani | H03H 5/12 |
| | | | 333/188 |
| 2016/0352368 A1 | 12/2016 | Khlat | |
| 2016/0359469 A1* | 12/2016 | Ella | H03H 7/38 |

OTHER PUBLICATIONS

Final Office Action for U.S. Appl. No. 15/006,540, dated Dec. 6, 2016, 6 pages.

* cited by examiner

TUNABLE NOTCH FILTER

RELATED APPLICATIONS

This application claims the benefit of provisional patent application Ser. No. 62/633,356, filed Feb. 21, 2018, the disclosure of which is hereby incorporated herein by reference in its entirety. This application is also related to U.S. Pat. No. 9,698,839, the disclosure of which is hereby incorporated herein by reference in its entirety.

FIELD OF THE DISCLOSURE

The present disclosure relates to tunable notch filters and in particular to tunable notch filters for radio frequency receivers.

BACKGROUND

As wireless communications standards continue to evolve to provide higher data rates, reliability, and network capacity, technologies such as carrier aggregation and multiple input, multiple output (MIMO) have become commonplace. Wireless communications devices utilizing carrier aggregation and/or MIMO use multiple antennas to simultaneously transmit and receive signals within different wireless operating bands. These wireless communications devices require specialized filtering circuitry to separate signals within the different wireless operating bands, which generally adds significant complexity and size to radio frequency (RF) front-end circuitry within the devices.

FIG. 1 is a schematic representation of conventional RF front-end circuitry 10 capable of operating in a carrier aggregation and/or MIMO configuration. The conventional RF front-end circuitry 10 includes a primary antenna 12A, a secondary antenna 12B, antenna switching circuitry 14, primary transceiver circuitry 16, and secondary receiver circuitry 18. The primary transceiver circuitry 16 and the secondary receiver circuitry 18 are coupled to the primary antenna 12A and the secondary antenna 12B via the antenna switching circuitry 14. As shown in FIG. 1, the antenna switching circuitry 14 is a dual-pole, dual-throw switch configured to couple the primary transceiver circuitry 16 to one of the primary antenna 12A and the secondary antenna 12B, and couple the secondary receiver circuitry 18 to the antenna 12 not coupled to the primary transceiver circuitry 16. In normal operation, the primary transceiver circuitry 16 is coupled to the primary antenna 12A in order to transmit and receive primary RF transmit signals and primary RF receive signals therefrom, while the secondary receiver circuitry 18 is coupled to the secondary antenna 12B in order to receive secondary RF receive signals. However, the antenna switching circuitry 14 may swap the primary antenna 12A and the secondary antenna 12B when the performance of the secondary antenna 12B is superior to that of the primary antenna 12A. For example, the antenna switching circuitry 14 may swap the primary antenna 12A and the secondary antenna 12B when a voltage standing wave ratio associated with the secondary antenna 12B is smaller than a voltage standing wave ratio associated with the primary antenna 12A.

The secondary receiver circuitry 18 includes filtering circuitry 20, receiver switching circuitry 22, and a number of low-noise amplifiers (LNAs) 24. The filtering circuitry 20 is coupled to the antenna switching circuitry 14, while the receiver switching circuitry 22 is coupled between the filtering circuitry 20 and the LNAs 24. The filtering circuitry 20 is configured to isolate signals within a particular operating band or group of operating bands received from the primary antenna 12A or secondary antenna 12B so that they may be separately processed. The receiver switching circuitry 22 is configured to couple an output of a filter or group of filters in the filtering circuitry 20 to one of the LNAs 24, where the isolated signal is then amplified for further processing, for example, baseband conversion. Each one of the LNAs 24 may be designed to amplify a particular operating band or group of operating bands efficiently and with low distortion.

The filtering circuitry 20 may include a number of acoustic filters 26, which may be isolated or grouped together with additional acoustic filters to form an RF multiplexer 28. In its simplest form, the filtering circuitry 20 includes an isolated acoustic filter 26 for each operating band supported by the secondary receiver circuitry 20. However, performance improvements and area reductions may be achieved by grouping the acoustic filters 26 into RF multiplexers 28. Generally, the acoustic filters are bandpass filters configured to pass one or more desired operating bands while attenuating all signals outside of the desired operating bands. The acoustic filters 26 must provide high attenuation at all frequencies outside of the desired passband to reduce undesirable distortion, while providing low insertion loss within the passband. The largest source of undesirable distortion in the conventional RF front-end circuitry 10 generally comes from antenna-to-antenna coupling of primary RF transmit signals into the signal path of the secondary receiver circuitry 18. The primary RF transmit signals are high-power signals compared with the secondary RF receive signals and thus can cause many problems such as desensitization of the secondary receiver circuitry 18. Accordingly, a main purpose of each one of the acoustic filters 26 is to attenuate primary RF transmit signals in the secondary receiver signal path while passing the secondary RF receive signals with as little attenuation as possible.

As the number of operating bands supported by modern wireless communications standards continue to increase, the complexity and size of the filtering circuitry 20, the receiver switching circuitry 22, and the LNAs 24 increases in turn. Since the area of RF front-end circuitry is a primary concern in portable wireless communications devices, there is a need for RF front-end circuitry configured to operate in carrier aggregation and/or MIMO configurations with reduced size and complexity.

SUMMARY

A tunable notch filter is disclosed with a first acoustic resonator coupled in series with a first inductive element between a filter input node and a filter output node. A first capacitor is coupled in parallel with the first acoustic resonator and the first inductive element. In at least one embodiment, the first capacitor is configured to have variable capacitance that is electronically tunable by way of an electronic controller. A second acoustic resonator is coupled in series with a second inductive element between the filter output node and a signal ground node. A second capacitor is coupled in parallel with the second inductive element. In at least one embodiment, the second capacitor is electronically tunable. The tunable notch filter is configured to provide a highly selective notch filter response between the filter input node and the filter output node with high attenuation.

In at least one embodiment, an Nth inductive element is coupled in series with an Nth acoustic resonator between the filter output node and the signal ground node and an Nth capacitor coupled in parallel with the Nth inductive element, wherein N is a natural number of 3 or more. In at least one embodiment, the Nth capacitor is electronically tunable.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
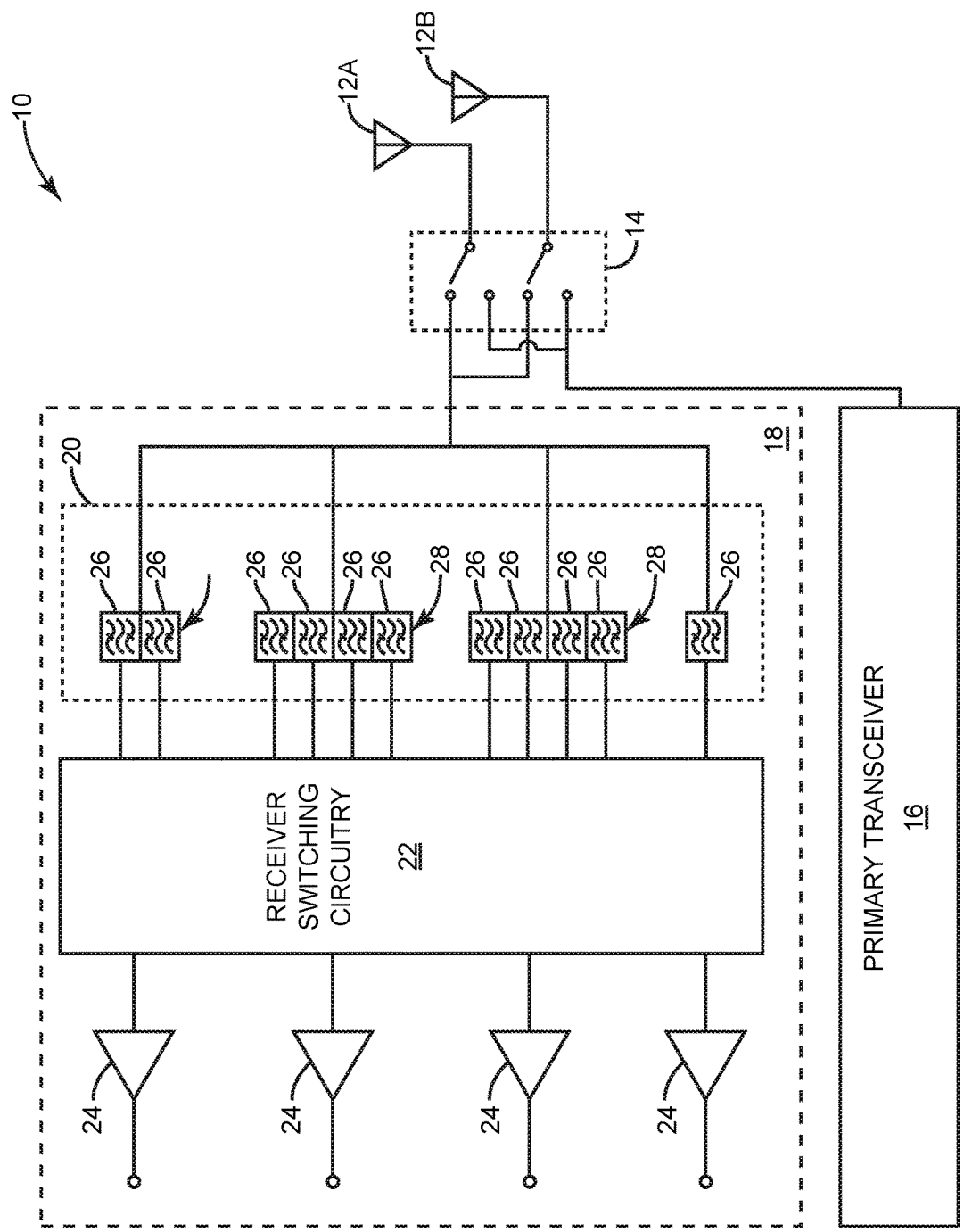
FIG. 1 is a schematic of related-art radio frequency front-end circuitry.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
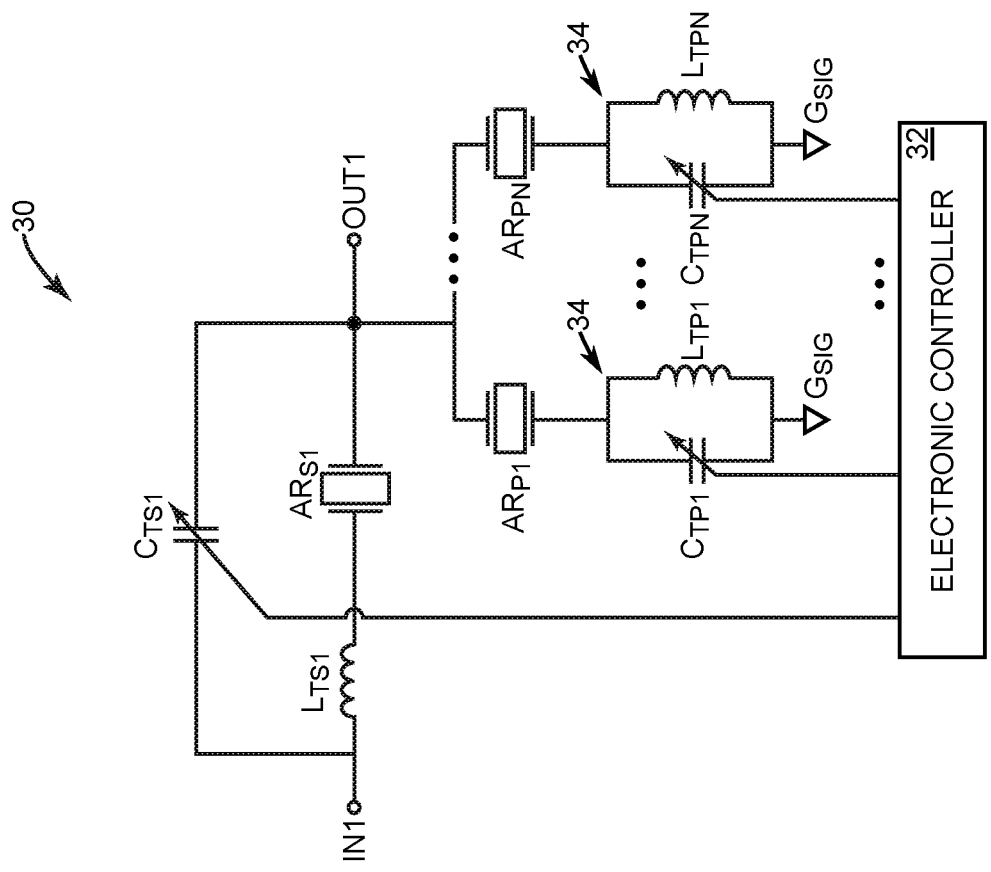
FIG. 2 is a schematic of an exemplary embodiment of a tunable notch filter that is configured in accordance with the present disclosure.

FIG. 2 is a schematic of an exemplary embodiment of a tunable notch filter 30 that is configured in accordance with the present disclosure. The tunable notch filter 30 includes a first acoustic resonator $AR_{S1}$ and a first inductive element $L_{TS1}$ coupled in series between a filter input node IN1 and a filter output node OUT1. A first capacitor $C_{TS1}$ is coupled in parallel with the first acoustic resonator $AR_{S1}$ and the first inductive element $L_{TS1}$, wherein the first capacitor $C_{TS1}$ is configured to have variable capacitance that is electronically tunable by way of an electronic controller 32. The tunable notch filter 30 further includes a second acoustic resonator $AR_{P1}$ and a second inductive element $L_{TP1}$ coupled in series between the filter output node OUT1 and a signal ground node $G_{SIG}$, and a second capacitor $C_{TP1}$ coupled in parallel with the second inductive element $L_{TP1}$.

In at least some exemplary embodiments, as depicted in FIG. 2, the tunable notch filter 30 further includes an Nth inductive element $L_{TPN}$ coupled in series with an Nth acoustic resonator $AR_{PN}$ between the filter output node OUT1 and the signal ground node $G_{SIG}$. An Nth capacitor $C_{TPN}$ is configured to have variable capacitance that is electronically tunable by way of the electronic controller 32 and is coupled in parallel with the Nth inductive element $L_{TPN}$, wherein N is a natural number of 3 or more. In particular, this embodiment has an N number of capacitors including the Nth capacitor $C_{TPN}$ and an N number of inductive elements including the Nth inductive element $L_{TPN}$ that make up a plurality of electronically tunable tank circuits 34. Each of the plurality of resonators $AR_{P1}$ through $AR_{PN}$ has a different resonant frequency.

In some embodiments, the electronic controller 32 is a baseband processor having digital control outputs that control digitally electronically tunable versions of the first capacitor $C_{TS1}$, the second capacitor $C_{TP1}$, and the Nth capacitor $C_{TPN}$. In other embodiments, the electronic controller 32 is an analog controller having analog control signals that control analog controllable versions of the first capacitor $C_{TS1}$, the second capacitor $C_{TP1}$, and the Nth capacitor $C_{TPN}$.

Figure 3:
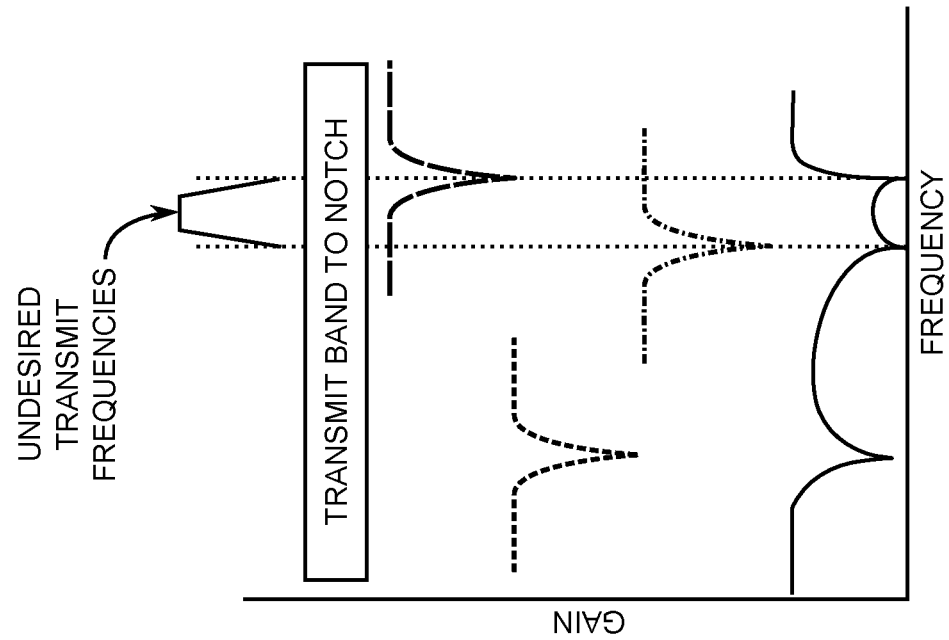
FIG. 3 is a graph of filter response of gain versus frequency for a first exemplary case in which undesired frequencies located near an upper edge of a transmit band to notch are attenuated.

FIG. 3 is a graph of filter response of gain versus frequency for a first exemplary case in which undesired frequencies located near an upper edge of a transmit band to notch are attenuated. In this first exemplary case, the first capacitor $C_{TS1}$ and the second capacitor $C_{TP1}$ through the Nth capacitor $C_{TPN}$ are set by way of the electronic controller 32 to their minimum capacitances. A first notch depicted in long dash line is positioned at a higher frequency edge of the undesired frequencies by setting the capacitance of the first capacitor $C_{TS1}$ to a minimum value. A second notch depicted in short dash line is positioned closer towards a lower edge of the transmit band to notch by setting the second capacitor $C_{TP1}$ to a minimum value. A third notch depicted in dash-dot line is positioned at a lower frequency edge of the undesired frequencies by setting the capacitance of the Nth capacitor $C_{TPN}$ to its minimum value. A resultant frequency response is depicted in solid line. Notice that the resultant frequency response shows that the undesired transmit frequencies are greatly attenuated relative to most other frequencies within the transmit band to notch.

Figure 4:
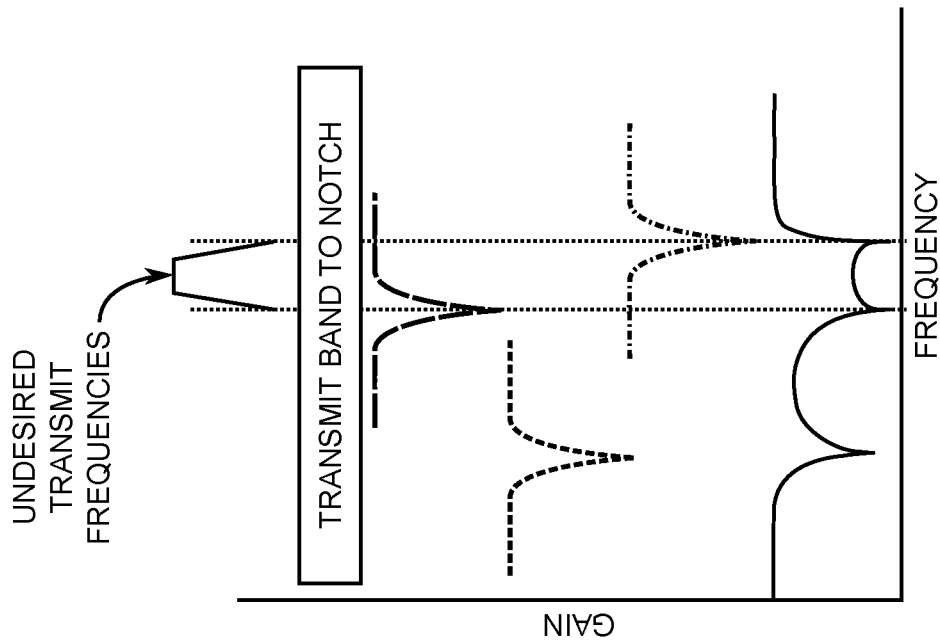
FIG. 4 is a graph of filter response for a second exemplary case in which undesired transmit frequencies located at lower frequencies within the upper half of the transmit band are attenuated.

FIG. 4 is a graph of filter response for a second exemplary case in which undesired transmit frequencies located at lower frequencies within the upper half of the transmit band are attenuated. In this second exemplary case, the first capacitor $C_{TS1}$ has increased capacitance, while the second capacitor $C_{TP1}$ and the Nth capacitor $C_{TPN}$ remain set to their minimum capacitance values.

Figure 5:
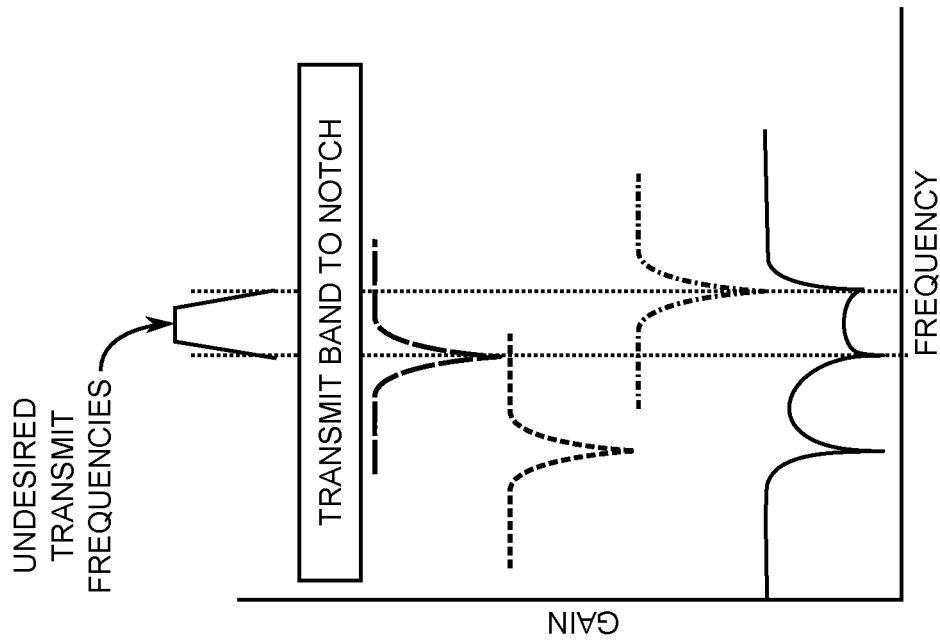
FIG. 5 is a graph of filter response for a third exemplary case in which undesirable frequencies near the center of the transmit band to notch are attenuated.

FIG. 5 is a graph of filter response for a third exemplary case in which undesirable frequencies near the center of the transmit band to notch are attenuated. In this third exemplary case, the first capacitor $C_{TS1}$ and the Nth capacitor $C_{TPN}$ have increased capacitance, while the second capacitor $C_{TP1}$ remains set to a minimum capacitance value.

Figure 6:
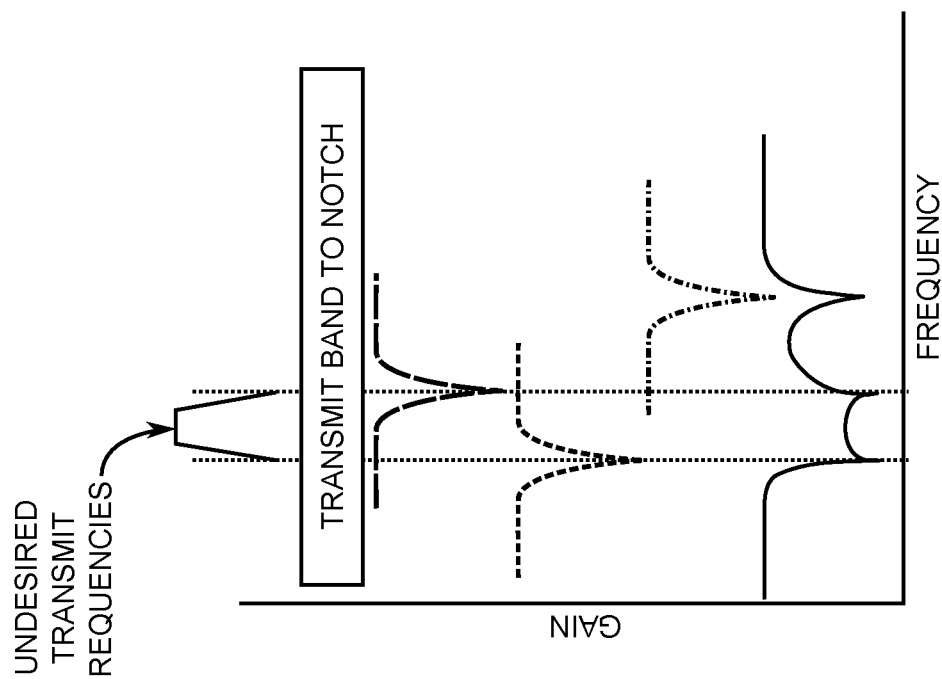
FIG. 6 is a graph of filter response for a fourth exemplary case in which undesired transmit frequencies located at frequencies within the lower half of the transmit band are attenuated.

FIG. 6 is a graph of filter response for a fourth exemplary case in which undesired transmit frequencies located at frequencies within the lower half of the transmit band are attenuated. In this fourth exemplary case, the first capacitor $C_{TS1}$ has increased capacitance, while the Nth capacitor $C_{TPN}$ remains constant and the second capacitor $C_{TP1}$ remains set to a minimum capacitance value.

Figure 7:
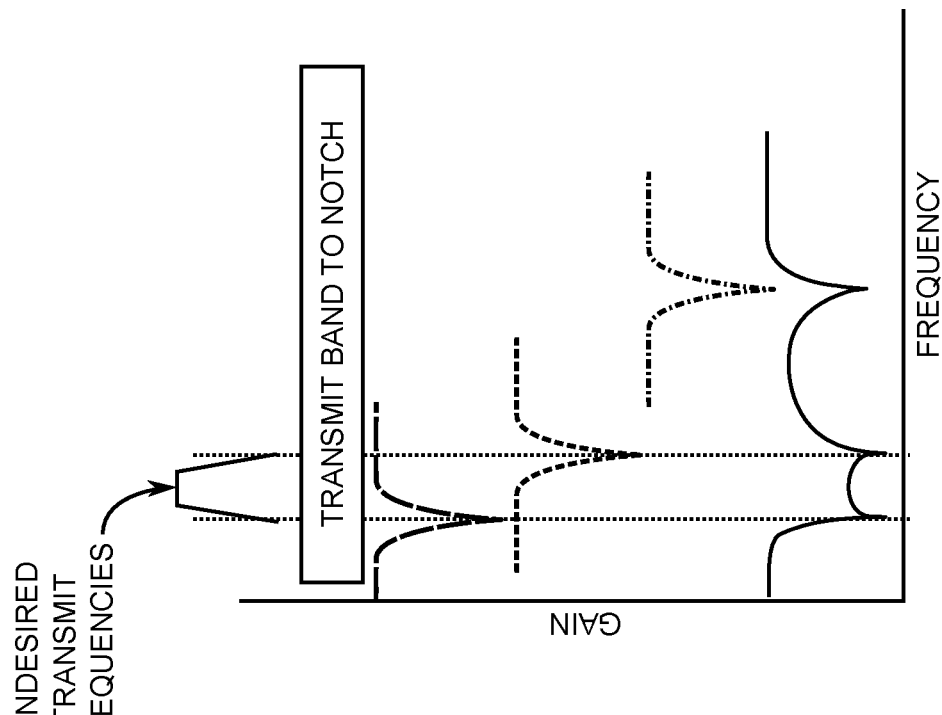
FIG. 7 is a graph of filter response for a fifth exemplary case in which undesired transmit frequencies located at lower frequencies within the lower half of the transmit band are attenuated.

FIG. 7 is a graph of filter response for a fifth exemplary case in which undesired transmit frequencies located at lower frequencies within the lower half of the transmit band are attenuated. In this fifth exemplary case, the first capacitor $C_{TS1}$ has further increased capacitance, while the Nth capacitor $C_{TPN}$ remains constant and the second capacitor $C_{TP1}$ remains set to a minimum capacitance value.

Figure 8:
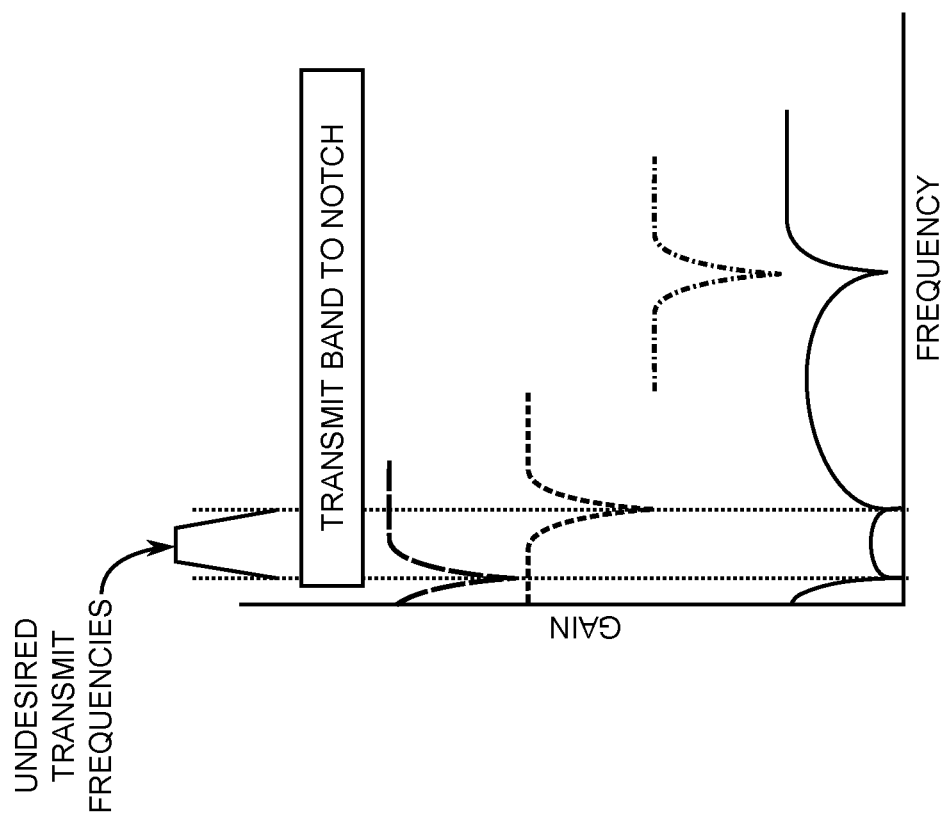
FIG. 8 is a graph of filter response for a sixth exemplary case in which undesired transmit frequencies located at lower frequencies within the lower edge of the transmit band are attenuated.

FIG. 8 is a graph of filter response for a sixth exemplary case in which undesired transmit frequencies located at lower frequencies within the lower edge of the transmit band are attenuated. In this sixth exemplary case, first capacitor $C_{TS1}$ has still further increased capacitance, and the second capacitor $C_{TP1}$ has increased capacitance to move the transmit band notch to the band edge while the Nth capacitor $C_{TPN}$ remains constant.

Figure 9:
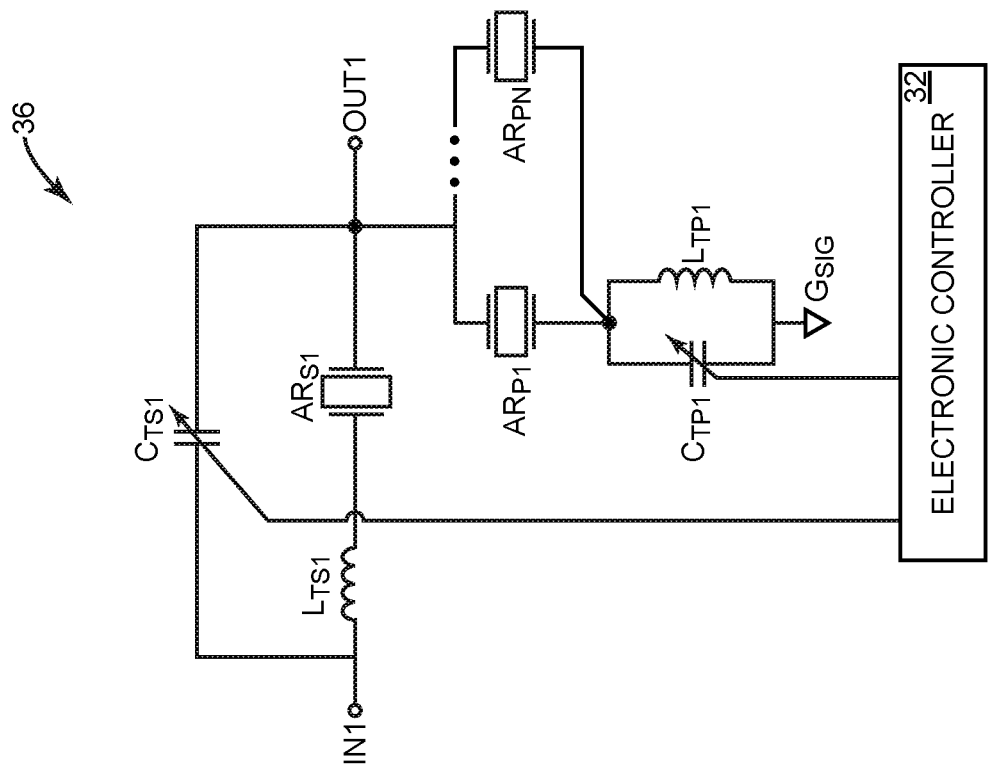
FIG. 9 is a schematic of another exemplary embodiment of a tunable notch filter that is configured in accordance with the present disclosure to have a plurality of resonators tuned by the series tuning capacitor and only one parallel tuning capacitor.

FIG. 9 is another exemplary embodiment of a tunable notch filter 36 that is configured in accordance with the present disclosure to have a plurality of resonators from second acoustic resonator $AR_{P1}$ through Nth acoustic resonator $AR_{PN}$ that are electronically tuned by only the first capacitor $C_{TS1}$ and the second capacitor $C_{TP1}$. In other words, the plurality of electronically tunable tank circuits 34 (FIG. 2) made up of an N number of capacitors such as the Nth capacitor $C_{TPN}$ and an N number of inductors such as the Nth inductive element $L_{TPN}$ is not incorporated in this embodiment.

Figure 10:
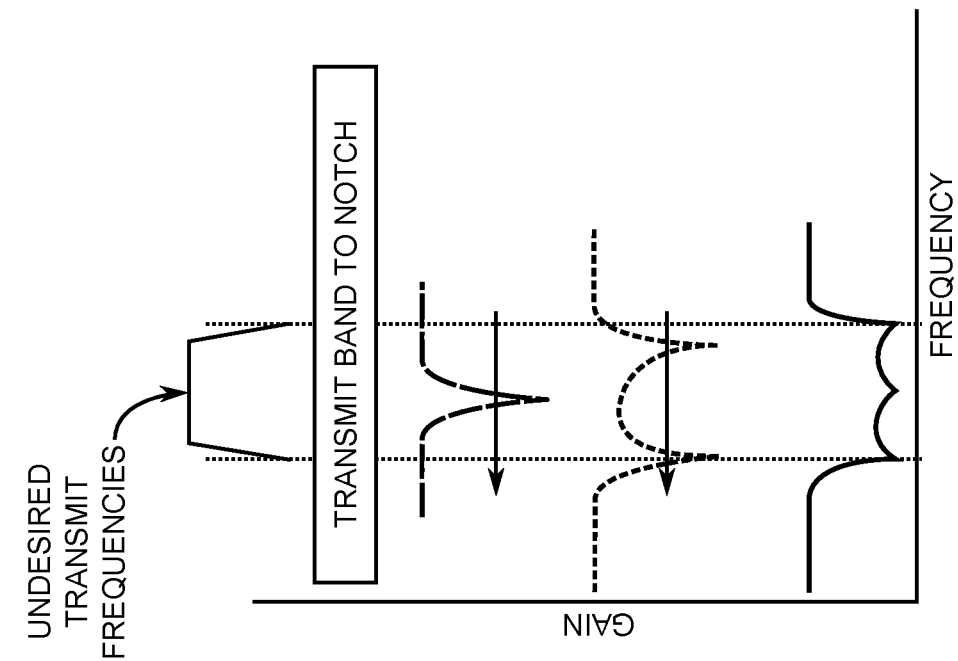
FIG. 10 is a graph of filter response for the exemplary embodiment of FIG. 9.

FIG. 10 is a graph of filter response for the exemplary embodiment of FIG. 9. In this particular example, the electronic controller 32 adjusts the capacitances of both the first capacitor $C_{TS1}$ and the second capacitor $C_{TP1}$ to provide the frequency response depicted in solid line adjacent to the horizontal axis representing frequency.

Figure 12:
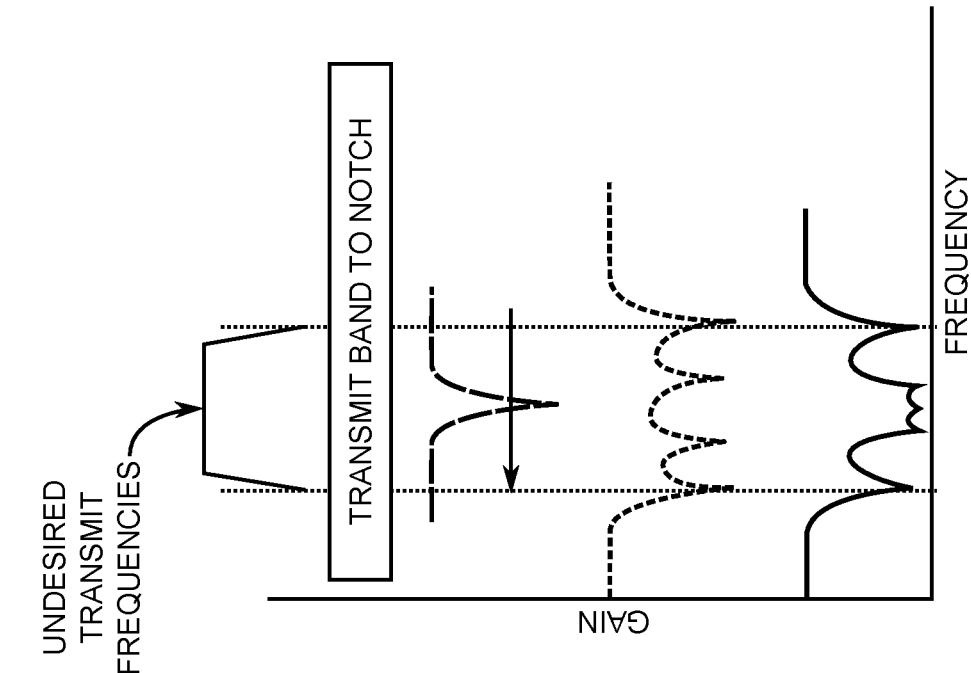
FIG. 12 is a graph of filter response for the exemplary embodiment of FIG. 11.
Figure 11:
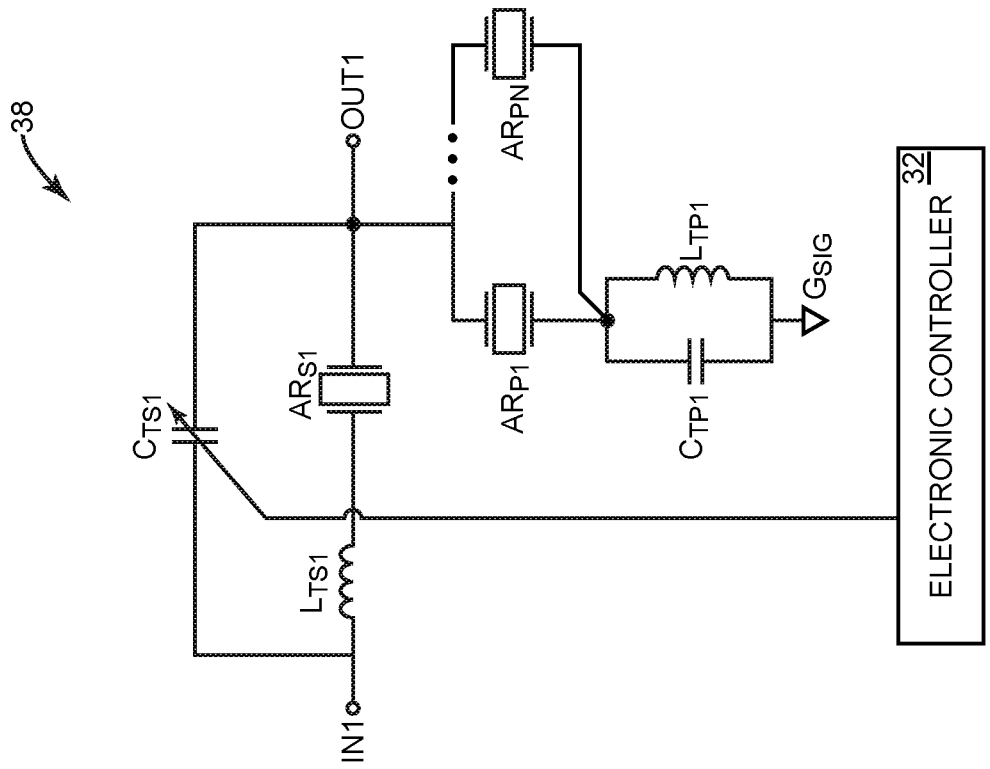
FIG. 11 is a schematic of yet another exemplary embodiment of a tunable notch filter that is configured in accordance with the present disclosure to have a plurality of resonators coupled to a filter input node.

FIG. 11 is yet another exemplary embodiment of a tunable notch filter 38 that is configured in accordance with the present disclosure to have the plurality of resonators from second acoustic resonator $AR_{P1}$ through Nth acoustic resonator $AR_{PN}$ that are electronically tuned by only the first capacitor $C_{TS1}$ and the second capacitor $C_{TP1}$. However, in this particular embodiment, the second capacitor $C_{TP1}$ has fixed capacitance and the first capacitor $C_{TS1}$ has capacitance that is controlled by the electronic controller 32. FIG. 12 is a graph of filter response for the exemplary embodiment of FIG. 11.

Figure 13:
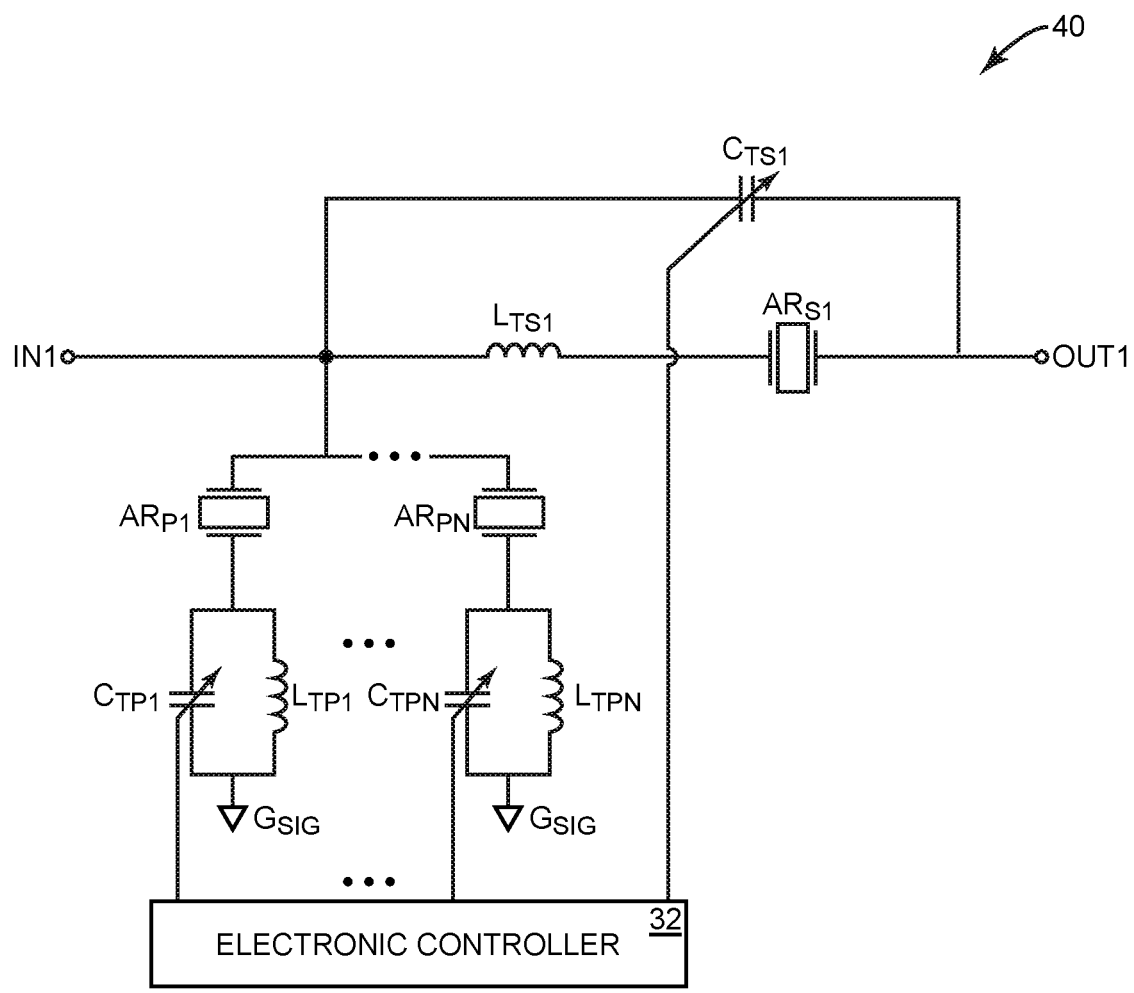
FIG. 13 is a schematic of still another exemplary embodiment of a tunable notch filter that is configured in accordance with the present disclosure to have a plurality of resonators tuned by the series tuning capacitor and a fixed capacitance parallel tuning capacitor.

FIG. 13 is a schematic of an exemplary embodiment of a tunable notch filter 40 that is configured in accordance with the present disclosure. The tunable notch filter 40 includes the first acoustic resonator $AR_{si}$ and the first inductive element $L_{TS1}$ coupled in series between the filter input node IN1 and the filter output node OUT1. As in the previous embodiments, the first capacitor $C_{TS1}$ is coupled in parallel with the first acoustic resonator $AR_{S1}$ and the first inductive element $L_{TS1}$, wherein the first capacitor $C_{TS1}$ is configured to have variable capacitance that is electronically tunable by way of the electronic controller 32. The tunable notch filter 40 further includes the second acoustic resonator $AR_{pi}$ and the second inductive element $L_{TP1}$. However, in this particular embodiment, the second acoustic resonator $AR_{P1}$ and the second inductive element $L_{TP1}$ are coupled in series between the filter input node IN1 and the signal ground node $G_{SIG}$. The second capacitor $C_{TP1}$ is coupled in parallel with the second inductive element $L_{TP1}$.

In at least some exemplary embodiments, as depicted in FIG. 13, the tunable notch filter 40 further includes an Nth inductive element $L_{TPN}$ coupled in series with an Nth acoustic resonator $AR_{PN}$ between the filter input node IN1 and the signal ground node $G_{SIG}$. An Nth capacitor $C_{TPN}$ is configured to have variable capacitance that is electronically tunable by way of the electronic controller 32 and is coupled in parallel with the Nth inductive element $L_{TPN}$, wherein N is a natural number of 3 or more. Frequency responses for the tunable notch filter 40 are the same as depicted in FIG. 3 through FIG. 8.

Figure 14:
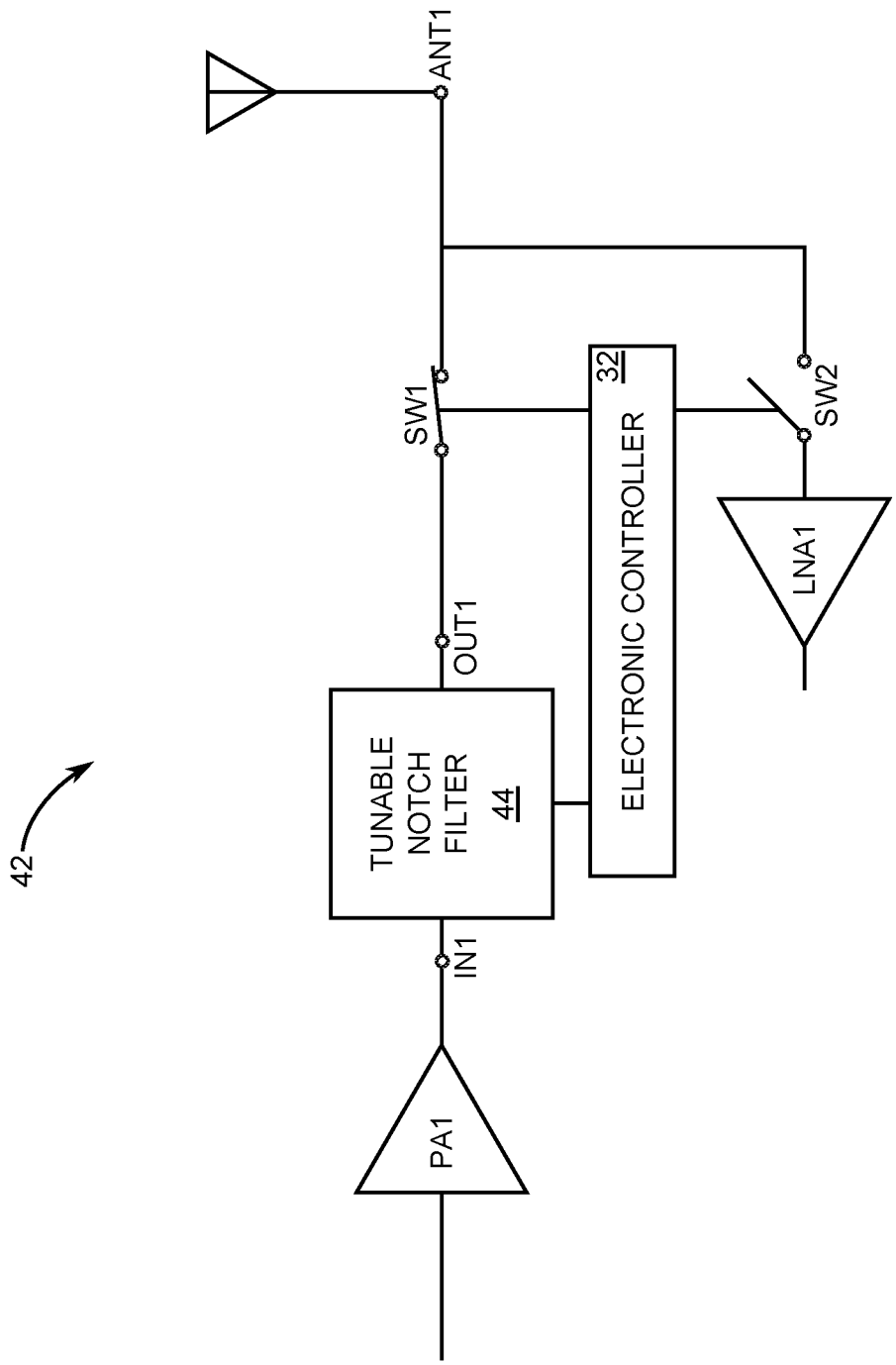
FIG. 14 is a radio front-end that incorporates any of the tunable notch filters of the present disclosure including a transmit switch coupled between a filter output node and an antenna terminal.

FIG. 14 is a schematic of an exemplary radio front-end 42 that incorporates a tunable notch filter 44 that can be any one of the tunable notch filters 30, 36, 38, and 40. In this particular embodiment, the tunable notch filter 44 is coupled between an output of a power amplifier PA1 and an antenna terminal ANT1. A transmit switch SW1 depicted in a closed position is coupled between the filter output OUT1 and the antenna terminal ANT1. A low-noise amplifier LNA1 is selectively coupled to the antenna terminal ANT1 through a second switch, a receive switch SW2, depicted in an open position. The electronic controller 32 electronically tunes the tunable notch filter 44 and controls selective opening and closing of the transmit switch SW1 and the receive switch SW2.

Figure 15:
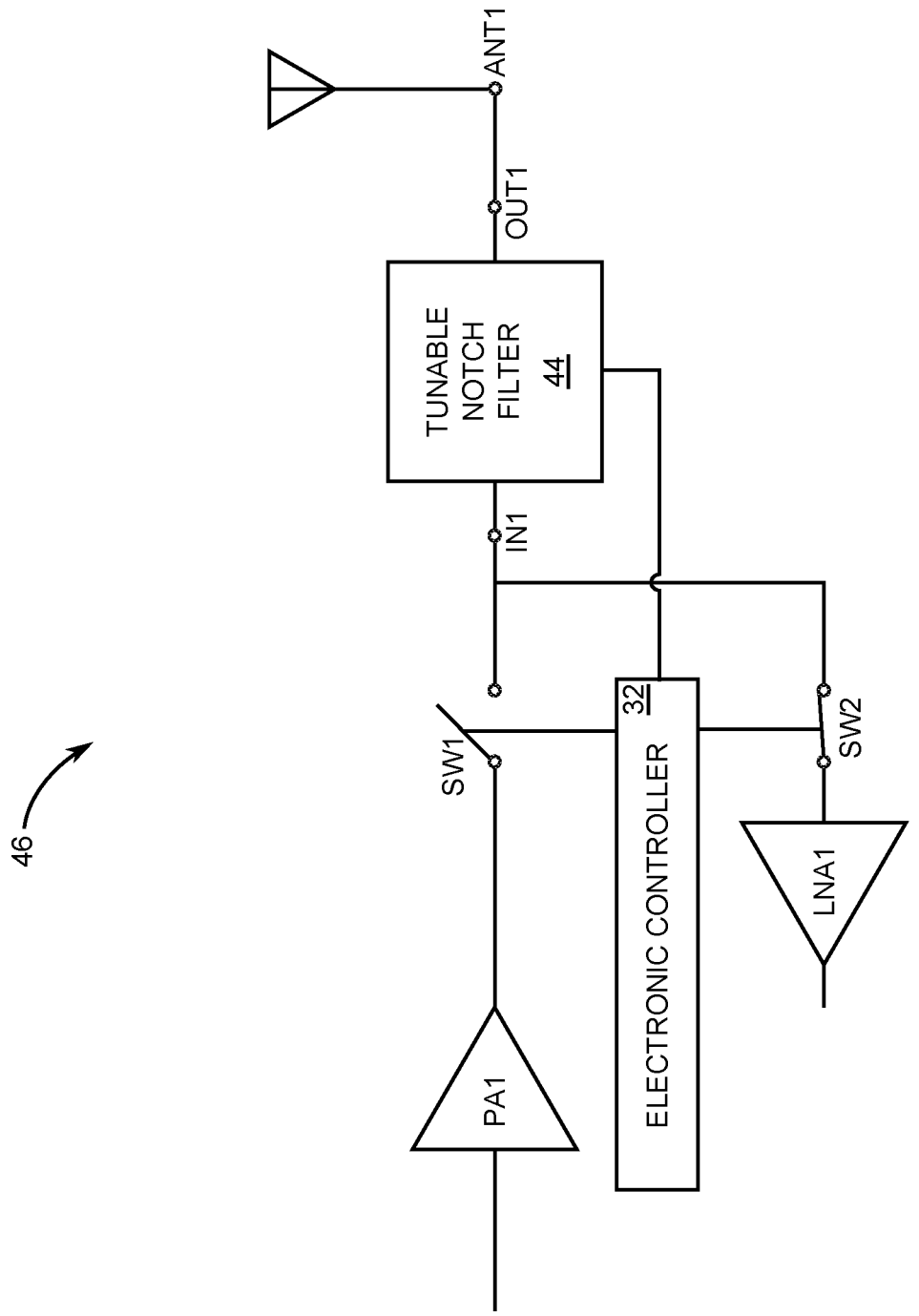
FIG. 15 is a radio front-end that can include any of the tunable notch filters of the present disclosure including a transmit switch coupled between a filter input node of the tunable notch filter and an output of a power amplifier.

FIG. 15 is a schematic of another exemplary radio front-end 46 that incorporates the tunable notch filter 44 that can be any one of the tunable notch filters 30, 36, 38, and 40. In this exemplary embodiment, the transmit switch SW1 is coupled between the filter input node IN1 and an output of the power amplifier PA1. In contrast to the embodiment of FIG. 14, in this embodiment the tunable notch filter 44 can also filter a receive band. The electronic controller 32 electronically tunes the tunable notch filter 44 and controls selective opening and closing of the transmit switch SW1 and the receive switch SW2.

Those skilled in the art will recognize improvements and modifications to the preferred embodiments of the present disclosure. All such improvements and modifications are considered within the scope of the concepts disclosed herein and the claims that follow.

What is claimed is:

1. A tunable notch filter comprising:
    a first acoustic resonator and a first inductive element coupled in series between a filter input node and a filter output node;
    a first capacitor coupled in parallel with the first acoustic resonator and the first inductive element, wherein the first capacitor is configured to have variable capacitance that is electronically tunable by way of an electronic controller;
    a second acoustic resonator and a second inductive element coupled in series between the filter output node and a signal ground node; and
    a second capacitor coupled in parallel with the second inductive element in a tank circuit configuration.

2. The tunable notch filter of claim 1 wherein the second capacitor is configured to have variable capacitance that is electronically tunable by way of the electronic controller.

3. The tunable notch filter of claim 1 wherein the first acoustic resonator and the second acoustic resonator are one of a bulk acoustic wave (BAW) resonator and a surface acoustic wave (SAW) resonator.

4. The tunable notch filter of claim 1 further including:
    an Nth inductive element coupled in series with an Nth acoustic resonator between the filter output node and the signal ground node; and
    an Nth capacitor configured to have variable capacitance that is electronically tunable by way of the electronic controller and coupled in parallel with the Nth inductive element, wherein N is a natural number of 3 or more.

5. The tunable notch filter of claim 4 wherein the Nth acoustic resonator is one of a BAW resonator and a SAW resonator.

6. The tunable notch filter of claim 1 further including an Nth acoustic resonator coupled in parallel with the second acoustic resonator, wherein N is a natural number of 3 or more.

7. The tunable notch filter of claim 6 wherein the Nth acoustic resonator is one of a BAW resonator and a SAW resonator.

8. A tunable notch filter comprising:
    a first acoustic resonator and a first inductive element coupled in series between a filter input node and a filter output node;
    a first capacitor coupled in parallel with the first acoustic resonator and the first inductive element, wherein the first capacitor is configured to have variable capacitance that is electronically tunable by way of an electronic controller;
    a second acoustic resonator and a second inductive element coupled in series between the filter input node and a signal ground node; and
    a second capacitor coupled in parallel with the second inductive element in a tank circuit configuration.

9. The tunable notch filter of claim 8 wherein the second capacitor is configured to have variable capacitance that is electronically tunable by way of the electronic controller.

10. The tunable notch filter of claim 8 wherein the first acoustic resonator and the second acoustic resonator are one of a bulk acoustic wave (BAW) resonator and a surface acoustic wave (SAW) resonator.

11. The tunable notch filter of claim 10 further including:
    an Nth inductive element coupled in series with an Nth acoustic resonator between the filter output node and the signal ground node; and
    an Nth capacitor configured to have variable capacitance that is electronically tunable by way of the electronic controller and coupled in parallel with the Nth inductive element, wherein N is a natural number of 3 or more.

12. A radio front-end comprising:
    a power amplifier; and
    a tunable notch filter coupled between an output of the power amplifier and an antenna terminal, wherein the tunable notch filter comprises:

a first acoustic resonator and a first inductive element coupled in series between a filter input node and a filter output node;

a first capacitor coupled in parallel with the first acoustic resonator and the first inductive element, wherein the first capacitor is configured have variable capacitance that is electronically tunable;

a second acoustic resonator and a second inductive element coupled in series between the filter output node and a signal ground node; and a second capacitor coupled in parallel with the second inductive element in a tank circuit configuration.

13. The radio front-end of claim 12 further including an electronic controller configured to electronically tune the variable capacitance of the first capacitor.

14. The radio front-end of claim 13 wherein the second capacitor is configured to have variable capacitance that is electronically tunable and the electronic controller is further configured to electronically tune the variable capacitance of the second capacitor.

15. The radio front-end of claim 13 further including:

an Nth inductive element coupled in series with an Nth acoustic resonator between the filter output node and the signal ground node; and an Nth capacitor configured to be controlled by the electronic controller and coupled in parallel with the Nth inductive element, wherein N is a natural number of 3 or more.

16. The radio front-end of claim 15 wherein the Nth acoustic resonator is one of a BAW resonator and a SAW resonator.

17. The radio front-end of claim 13 further including an Nth acoustic resonator coupled in parallel with the second acoustic resonator, wherein N is a natural number of 3 or more.

18. The radio front-end of claim 17 wherein the Nth acoustic resonator is one of a BAW resonator and a SAW resonator.

19. The radio front-end of claim 12 wherein the second capacitor is of a fixed capacitance type.

20. The radio front-end of claim 12 wherein a transmit switch is coupled between the filter output node of the tunable notch filter and the antenna terminal.

21. The radio front-end of claim 12 wherein a transmit switch is coupled between the power amplifier and the filter input node of the tunable notch filter.

22. The radio front-end of claim 12 wherein the first acoustic resonator and the second acoustic resonator are one of a bulk acoustic wave (BAW) resonator and a surface acoustic wave (SAW) resonator.

* * * * *